United States Patent
Newman (10) Patent No.: US 9,890,473 B2
(45) Date of Patent: Feb. 13, 2018

(54) BATCH EPITAXY PROCESSING SYSTEM HAVING GAS DEFLECTORS

(71) Applicant: Applied Materials, Inc., Santa Clara, CA (US)

(72) Inventor: Jacob Newman, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 152 days.

(21) Appl. No.: 14/735,189

(22) Filed: Jun. 10, 2015

(65) Prior Publication Data
US 2016/0002821 A1    Jan. 7, 2016

Related U.S. Application Data

(60) Provisional application No. 62/082,951, filed on Nov. 21, 2014, provisional application No. 62/020,722, filed on Jul. 3, 2014.

(51) Int. Cl.
C30B 25/14    (2006.01)
C30B 25/10    (2006.01)
C30B 25/12    (2006.01)

(52) U.S. Cl.
CPC .......... C30B 25/14 (2013.01); C30B 25/105 (2013.01); C30B 25/12 (2013.01)

(58) Field of Classification Search
CPC ......... C30B 25/00; C30B 25/02; C30B 25/10; C30B 25/105; C30B 25/12; C30B 25/14;
(Continued)

(56) References Cited

U.S. PATENT DOCUMENTS 5,551,982 A * 9/1996 Anderson ............. C23C 16/455
                                                         118/715
2003/0029384 A1* 2/2003 Nishikawa ............. C30B 25/12
                                                         118/730
(Continued)

FOREIGN PATENT DOCUMENTS

JP    2004-241460 A    8/2004
WO   WO 2012/036499  * 3/2012
WO   WO 2012/087002  * 6/2012

OTHER PUBLICATIONS

International Search Report and Written Opinion dated Sep. 23, 2015. for PCT/US2015/034896.

*Primary Examiner* — Kenneth A Bratland, Jr.
(74) *Attorney, Agent, or Firm* — Patterson + Sheridan LLP (57) ABSTRACT

Embodiments relate to methods and apparatus for batch processing of substrates during epitaxial film formation. In one example, a process chamber includes a chamber lid and substrate support. The chamber lid includes a centrally disposed gas inlet and a first gas deflector coupled to the chamber lid and adapted to direct the first process gas laterally across surfaces of a plurality of substrates. The lid also includes one or more gas outlets disposed radially outward of the centrally disposed gas inlet, and a plurality of lamps disposed between the centrally disposed gas inlet and the one or more gas outlets. The substrate support is rotatable and includes both a gas passage formed therein for introducing a second process gas to the internal volume of the process chamber and a second gas deflector adapted to direct the second process gas laterally across the surfaces of the plurality of substrates.

13 Claims, 6 Drawing Sheets

(58) Field of Classification Search
CPC ....... C30B 25/16; C30B 25/165; C30B 29/00; C30B 29/02; C30B 29/10; Y10T 117/00; Y10T 117/10; Y10T 117/1004; Y10T 117/1008; Y10T 117/1016; C23C 16/00; C23C 16/455; C23C 16/45563; C23C 16/45574; C23C 16/45587; C23C 16/45591; C23C 16/46
USPC .......... 117/84, 88–89, 93, 98, 101–102, 105, 117/107, 200–202, 204, 928, 937
See application file for complete search history.

(56) References Cited

U.S. PATENT DOCUMENTS

| | | |
|---|---|---|
| 2004/0060518 A1 | 4/2004 | Nakamura et al. |
| 2005/0000449 A1* | 1/2005 | Ishibashi ............. C23C 16/4585 118/728 |
| 2007/0215036 A1 | 9/2007 | Park et al. |
| 2009/0117272 A1 | 5/2009 | Behres |
| 2010/0263588 A1 | 10/2010 | Zhiyin |
| 2013/0180454 A1* | 7/2013 | Park .................. C23C 16/45508 118/728 |
| 2013/0260488 A1* | 10/2013 | Kim .................. C23C 16/45508 438/26 |
| 2013/0288460 A1 | 10/2013 | Ranish et al. |

\* cited by examiner

BATCH EPITAXY PROCESSING SYSTEM HAVING GAS DEFLECTORS

CROSS-REFERENCE TO RELATED APPLICATIONS

This application claims benefit of U.S. Provisional Patent Application Ser. No. 62/020,722, filed Jul. 3, 2014, and U.S. Provisional Patent Application Ser. No. 62/082,951, filed Nov. 21, 2014, which are herein incorporated by reference.

BACKGROUND

Field

Embodiments of the present disclosure generally relate to apparatus and methods for forming epitaxial materials on substrates, such as semiconductor substrates.

Description of the Related Art

Epitaxy refers to the formation of a crystalline overlayer on a crystalline substrate. Epitaxial films may be grown from gaseous or liquid precursors using the crystalline substrate as a seed crystal. Thus, the grown films may have the same or similar crystallographic orientation with respect to the crystalline substrate. Crystalline substrates are processed one at a time to obtain sufficient epitaxial film quality due to processing restraints with respect to process gas flow. However, because only a single substrate is processed at a time, epitaxial formation can often be a bottle neck of device throughput.

Therefore, there is a need for a method and apparatus to form epitaxial films on multiple substrates concurrently.

SUMMARY

Embodiments described herein generally relate to methods and apparatus for batch processing of substrates during epitaxial film formation. In one example, a process chamber includes a chamber lid and substrate support. The chamber lid includes a centrally disposed gas inlet and a first gas deflector coupled to the chamber lid and adapted to direct the first process gas laterally across surfaces of a plurality of substrates. The lid also includes one or more gas outlets disposed radially outward of the centrally disposed gas inlet. The lid also includes a plurality of lamps disposed between the centrally disposed gas inlet and the one or more gas outlets. The substrate support is rotatable and includes a gas passage formed therein. The gas passage introduces a second process gas to the internal volume of the process chamber. A second gas deflector is adapted to direct the second process gas laterally across the surfaces of the plurality of substrates.

In another example, a process chamber comprises a chamber body and a chamber lid disposed on the chamber body. The chamber lid includes a centrally disposed gas inlet for introducing a first process gas to an internal volume of the process chamber. The chamber lid also includes a first gas deflector coupled to the chamber lid for directing the first process gas laterally across surfaces of a plurality of substrates. The chamber lid also includes one or more gas outlets disposed radially outward of the centrally disposed gas inlet. A plurality of lamps is disposed within the chamber lid. The process chamber further comprises a rotatable substrate support disposed within the process chamber. The rotatable substrate support is adapted to support the plurality of substrates thereon. The rotatable substrate support includes a second gas deflector adapted to direct the second process gas laterally across the surface of the plurality of substrates.

In another example, a method of processing a plurality of substrates comprises introducing process gas through a gas inlet formed in a chamber lid. The chamber lid is positioned on a chamber body. The method further comprises deflecting the process gas laterally across the surfaces of one or more substrates. The method also includes introducing additional process gas through a gas inlet formed in a substrate support. The method also includes deflecting the additional process gas laterally across the surfaces of the one or more substrates. The method also includes exhausting the process gas and the additional process gas from the chamber body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to methods and apparatus for batch processing of substrates during epitaxial film formation. In one example, a process chamber includes a chamber lid and substrate support. The chamber lid includes a centrally disposed gas inlet and a first gas deflector coupled to the chamber lid and adapted to direct the first process gas laterally across surfaces of a plurality of substrates. The lid also includes one or more gas outlets disposed radially outward of the centrally disposed gas inlet, and a plurality of lamps disposed between the centrally disposed gas inlet and the one or more gas outlets. The substrate support is rotatable and includes a gas passage formed therein for introducing a second process gas to the internal volume of the process chamber. The substrate support also includes a second gas deflector adapted to direct the second process gas laterally across the surfaces of the plurality of substrates.

Figure 1:
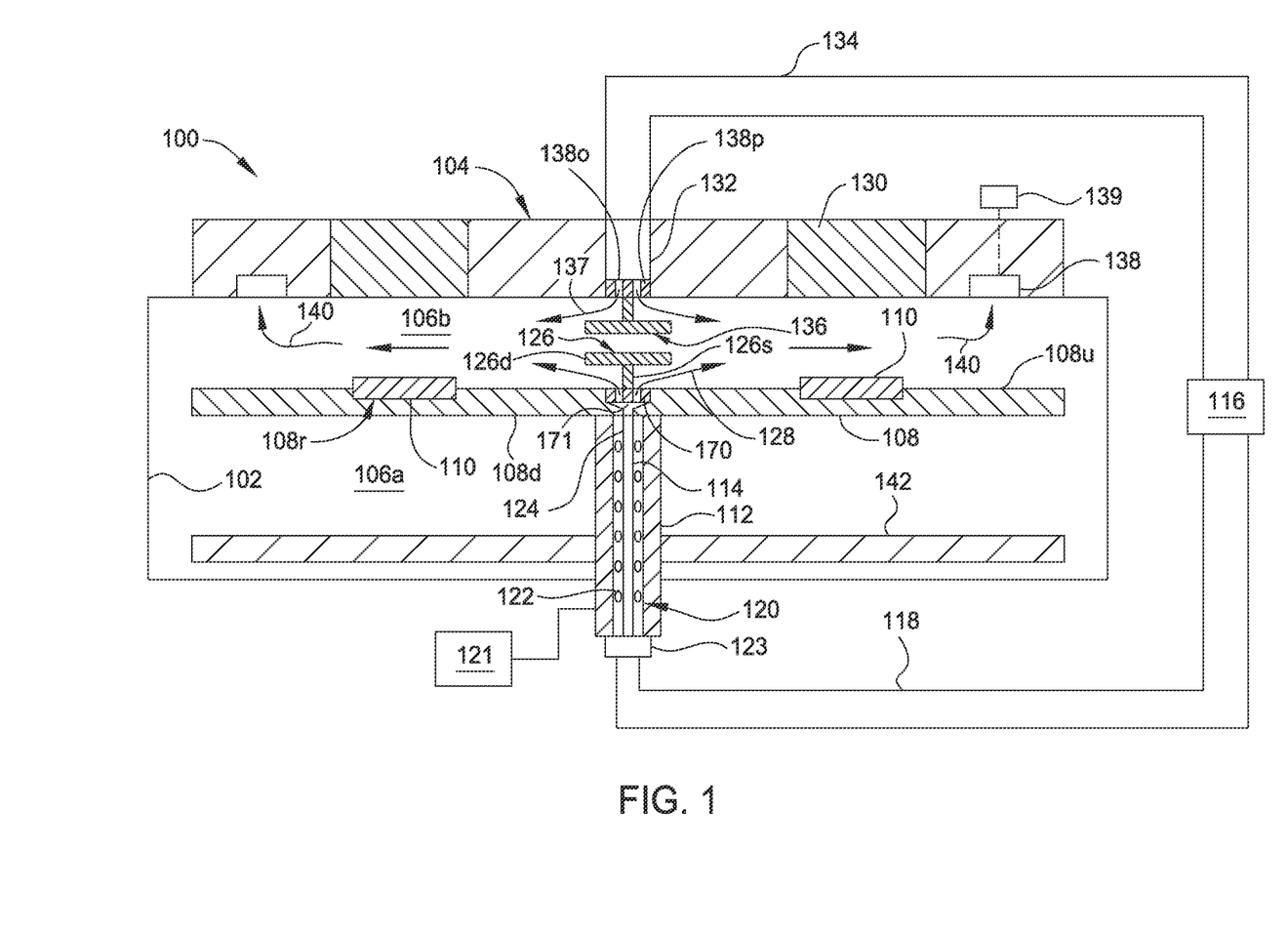
FIG. 1 illustrates a sectional view of a process chamber according to one embodiment of the disclosure.

FIG. 1 illustrates a sectional view of a process chamber 100 according to one embodiment of the disclosure. The process chamber 100 includes a chamber body 102 having a chamber lid 104 disposed thereon. The chamber body 102 defines an internal volume having a purge region 106a and a process region 106b. A substrate support 108 is positioned within the internal volume and divides the internal volume into the purge region 106a and the process region 106b. In one example, the substrate support 108 is a circular support member having an upper surface 108u and a lower surface 108d. The substrate support 108 is formed from graphite and may optionally include a silicon carbide coating thereon, and is adapted to support a plurality of substrate 110 on the upper surface 108u thereof. For example, the substrate support 108 may include one or more recess 108r formed therein for supporting four, six, eight, or more substrates 110.

A support shaft 112 is coupled to and centrally positioned relative to the lower surface 108d of the substrate support 108. The support shaft 112 is a cylindrical member formed from quartz, graphite, or graphite coated with silicon carbide. A gas conduit 114 is positioned axially within the support shaft 112 to facilitate transfer of process gas from a process gas source 116 to the process region 106b via gas lines 118. A bearing sleeve 120 containing a plurality of bearings 122 therein is positioned radially outward of the gas conduit 114. The bearing sleeve 120 facilitates rotation of the support shaft 112 relative to the stationary gas conduit 114 to effect rotation of the substrate support 108. A rotating seal 123 may be disposed between the support shaft 112 and the gas lines 118 to facilitate a fluid-tight connection therebetween. An actuator 121, such as a motor, is coupled to the support shaft 112 to facilitate rotational and vertical movement of the support shaft 112 and the substrate support 108 coupled thereto.

The substrate support 108 may include one or more gas passages 124 formed through a plate 170 disposed in a central portion of the substrate support 108. The central portion of the substrate support 108 may include a recess 171 formed therein to accommodate the plate 170. In one example, multiple gases may be introduced to the recess 171 before flowing through the plate 170. In such an example, the recess 171 facilitates mixing of gases prior to entering the process region 106b through the plate 170.

The gas passages 124 of the plate 170 facilitate transfer of process gas from the gas conduit 114 to the process region 106b through the substrate support 108. As process gas enters the process region 106b, the process gas contacts a gas deflector 126 centrally coupled to and extending from an upper surface 108u of the substrate support 108. The gas deflector 126 includes a support post 126s coupled to a lower surface of a gas deflection member 126d. In one example the gas deflection member 126d may be a disc-shaped or circular member, and the support post 126s may be disposed centrally relative thereto. In one example, the support post 126s may be coupled to a central portion of the plate 170.

The gas deflector 126 is positioned adjacent to the one or more gas passages 124 and is adapted to direct process gas exiting from the one or more gas passages 124 in a lateral direction, as illustrated by arrows 128. The process gas flows radially outward and flows parallel to an upper surface of the substrates 110 to facilitate formation of an epitaxial film on the upper surface of the substrates 110. In one example, a lower surface of the gas deflection member 126d may have a conical shape having surfaces disposed at an angle relative to the upper surface 108u of the substrate support 108. In one example, the lower surface of the gas deflection member 126d may positioned at an angle relative to the upper surface 108u between about parallel and about 60 degrees. In one example, the gas deflector 126 may be formed form quartz; however, other materials are also contemplated.

A chamber lid 104 is supported on the chamber body 102. The chamber lid 104 may be formed from stainless steel, aluminum, or other metals and metal alloys. The chamber lid includes a plurality of lamps 130 disposed therein and exposed on a lower surface thereof in order to facilitate radiant heating of the substrates 110 positioned thereunder. The plurality of lamps 130 may be positioned in a circular configuration to track the rotation of the substrates 110. A gas conduit 132 is disposed radially inward of the plurality of lamps 130 and centrally with respect to the chamber lid 104. The gas conduit 132 is disposed axially through the chamber lid 104 to fluidly couple process gas line 134 to the process region 106b through openings 138o formed in a plate 138p. The process gas line 134 is coupled to the process gas source 116. The process gas source 116 may provide one or more process gases, including silicon or germanium sources, inert gases, group III sources, group V sources, and dopants such as n-type or p-type dopants. Process gas provided through the gas conduit 132 is a redirected by a gas deflector 136. The gas deflector may be the same or similar to the gas deflector 126, and may direct incoming process gas radially outward as shown by arrows 137. In one example, gas deflected by the gas deflectors 126 and 136 maintains a laminar flow regime as the process gas flows adjacent to substrates 110 to facilitate uniform epitaxial formation. The distance between the gas deflectors 126 and 136 may be about 2 mm or less in a processing or elevated position of the substrate support 108.

One or more exhaust plenums 138 are disposed radially outward of the plurality of lamps 130 to facilitate evacuation of gas from the process region 106b. The one or more exhaust plenums 138 are formed in a lower surface of the chamber lid 104, and are positioned sufficiently radially outward of the substrates 110 to facilitate a parallel gas flow relative to the upper surface of the substrates 110. For example, as shown in FIG. 1A, the one or more exhaust plenums 138 are positioned such that an upward flow of process gas towards the exhaust plenums, as shown by arrows 140, does not begin until radially outward of the substrates 110. The one or more exhaust plenums 138 may be coupled to an exhaust pump 139 to facilitate removal of process gases from the process region 106b.

A heater 142, such as a resistive heater, may be positioned within the purge region 106a beneath the substrate support 108. The heater 142 may be coupled to or supported by a lower surface of the chamber body 102. The heater 142 may have a similar footprint as the substrate support 108. Alternatively, the heater 142 may be a plurality of lamps adapted to direct radiant heat to the substrate support 108.

In an alternative embodiment, it is contemplated that one of the gas deflectors 126, 136 may be omitted. In such an embodiment, an opposite surfaces of the remaining gas deflector may be utilized to deflect process gas introduced to the process chamber 100 through both the chamber lid 104 and the substrate support 108.

Figure 2:
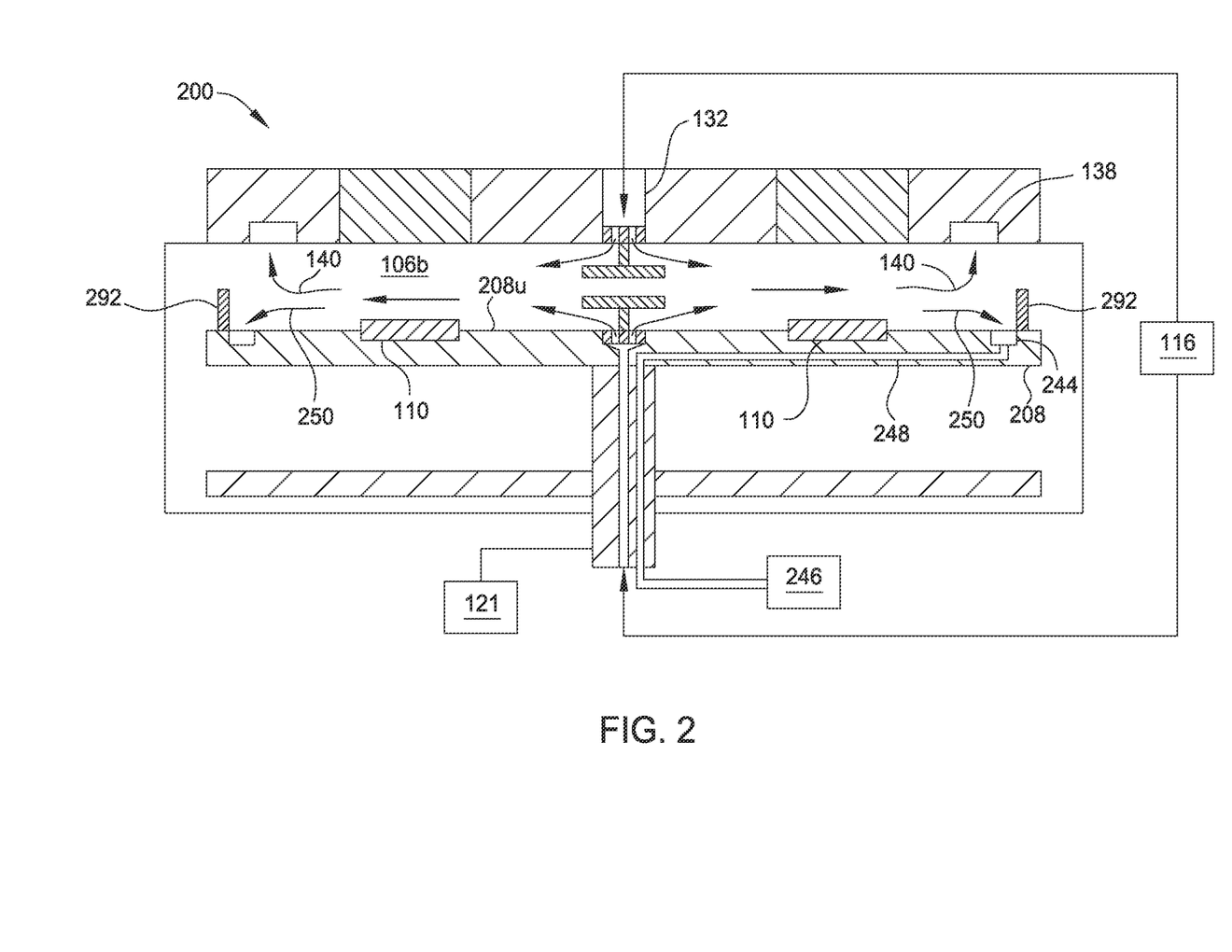
FIG. 2 illustrates a sectional view of a process chamber according to another embodiment of the disclosure.

FIG. 2 illustrates a sectional view of a process chamber 200 according to another embodiment of the disclosure. The process chamber 200 is similar to the process chamber 100, however, the process chamber 200 includes a substrate support 208 having one or more exhaust plenums 244 formed therein. The one or more exhaust plenums 244 facilitate removal of gases through the substrate support 208. The one or more exhaust plenums 244 are formed in the upper surface 208u of the substrate support 208 and are disposed laterally outward of substrates 110. In one example, the one or more exhaust plenums 244 may be disposed proximate an outer edge of the substrate support 208. In one example, the one or more exhaust plenums 244 is a circular or ring-shaped channel.

The one or more exhaust plenums 244 are coupled to an exhaust pump 246 via one or more conduits 248 (one is shown) to facilitate removal of gases through the substrate support 208. The one or more exhaust plenums 244 are disposed opposite the one or more exhaust plenums 138; however, it is contemplated that the one or more exhaust plenums 244 may be disposed radially inward or outward relative to the one or more exhaust plenums 138. The one or more exhaust plenums 244 may be discrete plenums positioned at predetermined intervals around the periphery of the substrate support 208. Alternatively, the one or more exhaust plenums 244 may be a continuous exhaust channel formed around the periphery of the substrate support 208.

In another example, the one or more exhaust plenums 244 may be positioned adjacent to and in close proximity with the radially outward edges of the substrates 110. The one or more exhaust plenums 244 further facilitate lateral gas flow parallel to the surface of the substrate 110 by influencing the flow of gas as it is exhausted, as shown by arrow 250. Thus, some process gas is drawn upward as shown by arrow 140, while some gas is drawn downwards, as shown by arrow 250, resulting in a net lateral flow as gas moves relative to the substrates 110. The net lateral flow enhances deposition uniformity. It is contemplated that the relative amount of gas evacuated through the one or more exhaust plenums 138, 244 may be adjusted to achieve the desired flow regime of process gas within the process region 106b. A gas deflector 292 may be positioned radially outward of each of the one or more exhaust plenums 244 to facilitate directing of gas into the one or more exhaust plenums 244. The gas deflector 292 may be positioned at an angle with respect to the upper surface of the substrate support 208, such as about 45 degrees to about 135 degrees, for example, 90 degrees. While not shown for clarity, it is contemplated that the process chamber 200 may include a bearing sleeve 120 and a rotating seal 123 (shown in FIG. 1) to facilitate rotation of the substrate support 208. The actuator 121 may facilitate vertical and/or rotational actuation of the substrate support 208. Additionally, although not shown, it is to be understood that the process chamber 200 may include one or more pyrometers disposed therein for detecting a temperature of the substrates 110.

Figure 3:
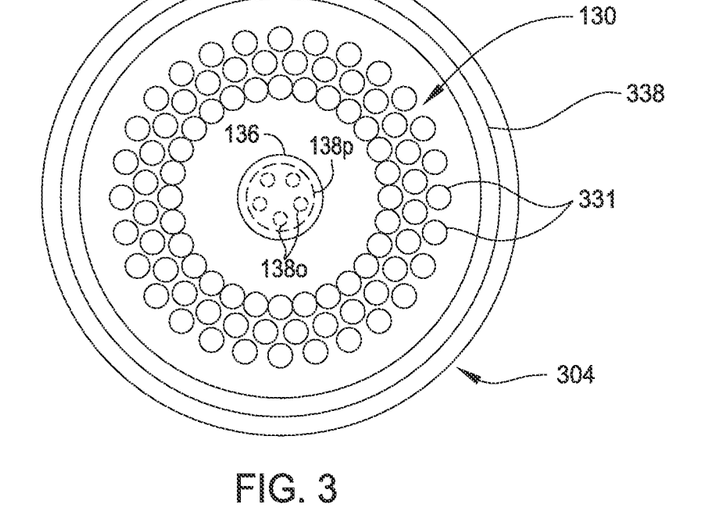
FIG. 3 illustrates a bottom plan view of a chamber lid, according to one embodiment of the disclosure.

FIG. 3 illustrates a bottom plan view of a chamber lid 304, according to one embodiment of the disclosure. The chamber lid 304 is similar to the chamber lid 104; however, the chamber lid 304 includes a ring-shaped exhaust plenum 338 disposed at a radially-outward edge thereof. A plurality of lamps 130 including individual lamps 331 are disposed radially inward of the ring-shaped exhaust plenum 338 and radially outward of the gas deflector 136. Multiple openings 138o are formed in the chamber lid 304 and are positioned beneath the gas deflector 136 for facilitating introduction of process gases into a process chamber. The openings 138o are shown in phantom. It is contemplated that the size, position, and amount of lamps 331 may be adjusted to affect a desired level of heating of substrates. Other lamp patterns and configurations are contemplated.

Figure 4:
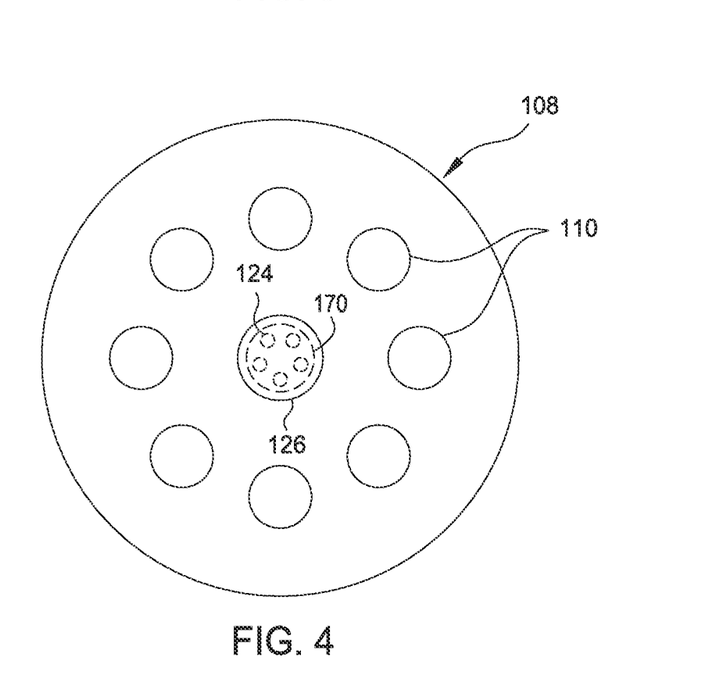
FIG. 4 illustrates a top plan view of a substrate support, according to one embodiment of the disclosure.

FIG. 4 illustrates a top plan view of a substrate support 108, according to one embodiment of the disclosure. The substrate support 108 includes a centrally positioned gas deflector 126, under which one or more gas passages 124 (five are shown) are disposed to facilitate introduction of process gases to the internal volume of the process chamber. A plurality of substrates may be disposed on the substrate support 108 to facilitate formation of an epitaxial film thereon. Although eight substrates 110 are shown, it is contemplated that more or less substrates 110 may be positioned on the substrate support 108, and that the substrate support 108 may be sized accordingly.

Figure 5:
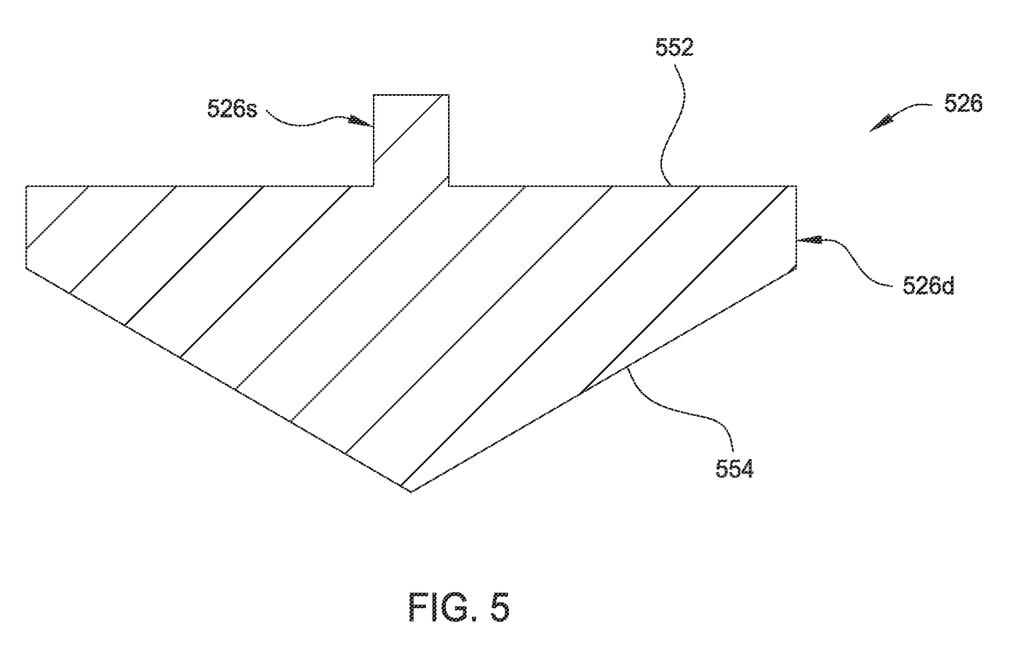
FIG. 5 illustrates a sectional view of a gas deflector, according to one embodiment of the disclosure.

FIG. 5 illustrates a sectional view of a gas deflector 526, according to one embodiment of the disclosure. The gas deflector 526 may be used in place of the gas deflectors 126 and 136 shown in FIG. 1. In one example, a single gas deflector 526 may replace both gas deflectors 126 and 136. The gas deflector 526 includes a support post 526s for coupling the gas deflector 526 to a chamber lid or to a substrate support. The support post 526s is coupled to or integrally formed with a gas deflection member 526d.

The gas deflection member 526d includes a first gas deflection surface 552 disposed adjacent the support post 526s. The first gas deflection surface 552 is adapted to laterally direct process gas introduced to a process chamber through a conduit (not shown) adjacent the first gas deflection surface 552. The first gas deflection surface may be disposed at an angle of about 5 degrees to about 90 degrees relative to the support post 526s, such as about 45 degrees to about 90 degrees.

The gas deflection member 526d also includes a second gas deflection surface 554 disposed opposite of the first gas deflection surface 552. The second gas deflection surface 554 is conically shaped and is adapted to laterally deflect process gas directed at that second gas deflection surface 554. In one embodiment, it is contemplated that the second gas deflection surface 554 may be planar or substantially planar.

Figure 6:
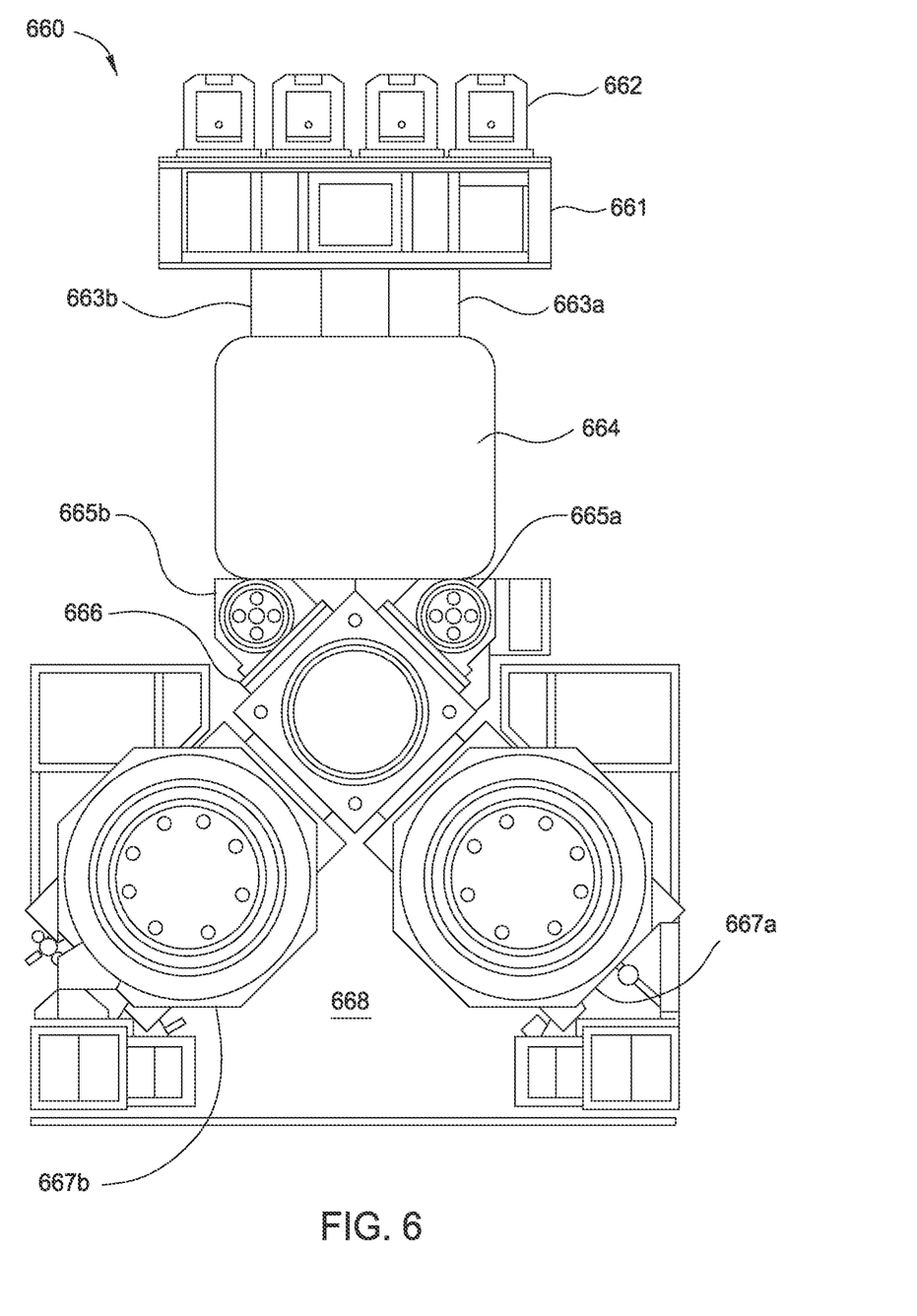
FIG. 6 illustrates a processing system, according to one embodiment of the disclosure.

FIG. 6 illustrates a processing system 660 according to one embodiment of the disclosure. The processing system 660 includes a factory interface 661 adapted to receive substrates for processing from one or more cassettes 662. The factory interface 661 includes a robot therein for transferring robots to/from load locks 663a, 663b. The load locks 663a, 663b facilitate transfer of substrates to and from a batch substrate pre-clean chamber 664. The batch substrate pre-clean chamber 664 may adapted to remove oxides, such as native oxides, from the surfaces of substrates disposed therein.

The batch substrate pre-clean chamber 664 is coupled to a mainframe 666 through one or more buffer chambers 665a, 665b (two are shown). The mainframe 666 facilitates transfer of substrates from the one or more buffer chambers 665a, 665b to process chamber 667a, 667b. In one embodiment, one or more of the process chambers 667a, 667b may be a process chamber such as process chambers 100, 200 described herein. Due to the positioning of the process chambers 667a, 667b, side access of the process chambers 667a, 667b is permitted from an area 668, thereby reducing the footprint of the processing system 660.

Figure 7:
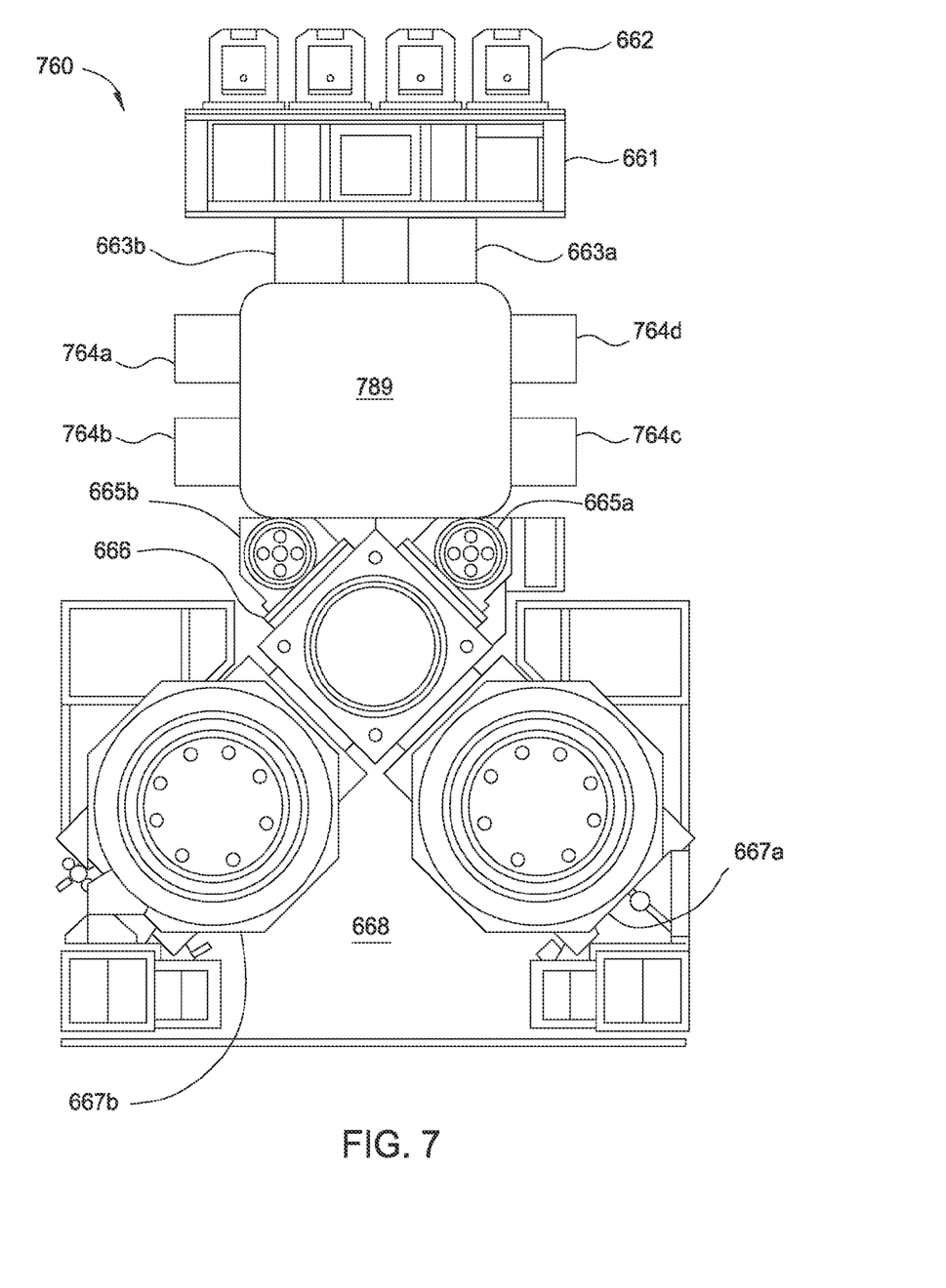
FIG. 7 illustrates a processing system, according to another embodiment of the disclosure.

FIG. 7 illustrates a processing system 760 according to another embodiment of the disclosure. The processing system 760 is similar to the processing system 660; however, the pre-clean chamber 664 may be replaced with a transfer chamber 789 housing one or more robots therein and adapted to transfer substrates therethrough. A plurality of pre-clean chambers 764a-d (four are shown) may be disposed about in and communication with the transfer chamber. Each of the pre-clean chambers 764a-d may be adapted to receive a substrate from the transfer chamber 789, and to perform a pre-clean operation therein on the substrate before the substrate is transferred back to the transfer chamber 789.

Benefits of embodiments herein include uniform epitaxial deposition during batch process of substrates, thus increasing substrate throughput. While embodiments herein generally use lamps for heating of substrates, it is contemplated that resistive heaters may also be utilized in addition to, or as an alternative to, lamps.

While the foregoing is directed to embodiments of the present disclosure, other and further embodiments of the disclosure may be devised without departing from the basic scope thereof, and the scope thereof is determined by the claims that follow.

What is claimed is:

1. A process chamber, comprising:
   a chamber lid having:
     a centrally disposed gas conduit adapted to introduce a first process gas to an internal volume of the process chamber;
     one or more gas outlets disposed radially outward of the centrally disposed gas conduit; and
     a first gas deflector positioned to direct the first process gas laterally;
     a plurality of lamps disposed within the chamber lid, the plurality of lamps positioned between the centrally disposed gas conduit and the one or more gas outlets; and
   a rotatable substrate support disposed within the process chamber, the rotatable substrate support including:
     a gas conduit formed therein for introducing a second process gas to the internal volume of the process chamber;
     a second gas deflector positioned to direct the second process gas laterally, the second gas deflector comprising a support post centrally coupled to a gas deflection member;
     a recess formed centrally in an upper surface of the rotatable substrate support;
     a plate having a plurality of openings formed therethrough, the plate disposed within the recess, wherein the support post of the second gas deflector is coupled to the plate;
     a plurality of substrate support recesses formed in the upper surface of the rotatable substrate support; and
     one or more exhaust plenums formed in the upper surface of the rotatable substrate support, the one or more exhaust plenums disposed radially outward of the substrate support recesses.

2. The process chamber of claim 1, further comprising one or more additional gas deflectors positioned adjacent each of the one or more exhaust plenums.

3. The process chamber of claim 2, wherein each additional gas deflector is positioned at angle of 45 degrees to 135 degrees with respect to the upper surface of the rotatable substrate support.

4. The process chamber of claim 1, further comprising a rotatable gas seal disposed between the gas conduit formed in the rotatable substrate support and a support shaft of the rotatable substrate support.

5. The process chamber of claim 1, further comprising an actuator coupled to the rotatable substrate support to vertically actuate the rotatable substrate support.

6. The process chamber of claim 1, wherein the one or more gas outlets of the chamber lid is a ring-shaped exhaust outlet.

7. A process chamber, comprising:
   a chamber body;
   a chamber lid disposed on the chamber body, the chamber lid including:
     a centrally disposed gas conduit for introducing a first process gas to an internal volume of the process chamber;
     a first gas deflector coupled to the chamber lid for directing the first process gas laterally within the internal volume of the process chamber;
     one or more gas outlets disposed radially outward of the centrally disposed gas conduit; and
     a plurality of lamps disposed within the chamber lid; and
   a rotatable substrate support disposed within the process chamber, the rotatable substrate support including:
     a second gas deflector positioned to direct a second process gas laterally, the second gas deflector comprising a support post centrally coupled to a gas deflection member;
     a recess formed centrally in an upper surface of the substrate support;
     a plate having a plurality of openings formed therethrough, the plate disposed within the recess of the substrate support, wherein the support post of the second gas deflector is coupled to the plate;
     a plurality of substrate support recesses formed in the upper surface of the rotatable substrate support; and
     one or more exhaust plenums formed in the upper surface of the rotatable substrate support, the one or more exhaust plenums disposed radially outward of the substrate support recesses.

8. The process chamber of claim 7, wherein the plurality of lamps is coupled to the chamber lid between the centrally disposed gas conduit and the one or more gas outlets.

9. The process chamber of claim 7, wherein the rotatable substrate support comprises a gas conduit formed therein for introducing the second process gas to the internal volume of the process chamber.

10. The process chamber of claim 7, further comprising a heater disposed in a lower portion of the chamber body.

11. The process chamber of claim 1, wherein the chamber lid further comprises a second plate having openings therethrough, and wherein the first gas deflector comprises a second post centrally coupled to a second gas deflection member, and the second post is coupled to the second plate.

12. The process chamber of claim 7, wherein the chamber lid further comprises a second plate having openings therethrough, and wherein the first gas deflector comprises a second post centrally coupled to a second gas deflection member, and the second post is coupled to the second plate.

13. A process chamber, comprising:
   a chamber lid having:
     a centrally disposed gas conduit fluidly coupled to an internal volume of the process chamber;
     one or more gas outlets disposed radially outward of the centrally disposed gas conduit;
     a first gas deflector positioned to direct a first process gas laterally within the internal volume of the process chamber; and
     a plurality of lamps disposed within the chamber lid, the plurality of lamps positioned between the centrally disposed gas conduit and the one or more gas outlets; and
   a rotatable substrate support disposed within the process chamber, the rotatable substrate support including:
     a gas passage formed therein for introducing a second process gas to the internal volume of the process chamber;

a second gas deflector positioned to direct the second process gas laterally within the internal volume of the process chamber, the second gas deflector comprising a support post centrally coupled to a gas deflection member;

a recess formed centrally in an upper surface of the rotatable substrate support; and a plate having a plurality of openings formed therethrough, the plate disposed within the recess, wherein the support post of the second gas deflector is coupled to the plate;

a plurality of substrate support recesses formed in the upper surface of the rotatable substrate support; and one or more exhaust plenums formed in the upper surface of the rotatable substrate support, the one or more exhaust plenums disposed radially outward of the substrate support recesses.

* * * * *